(12) United States Patent
Yuan

(10) Patent No.: US 10,516,120 B2
(45) Date of Patent: Dec. 24, 2019

(54) FLEXIBLE OLED DISPLAY AND MANUFACTURING METHOD THEREOF

(71) Applicant: Wuhan China Star Optoelectronics Semiconductor Display Technology Co., Ltd., Wuhan, Hubei (CN)

(72) Inventor: Chaoyu Yuan, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 119 days.

(21) Appl. No.: 15/579,401

(22) PCT Filed: Nov. 14, 2017

(86) PCT No.: PCT/CN2017/110825
§ 371 (c)(1),
(2) Date: Dec. 4, 2017

(87) PCT Pub. No.: WO2019/085012
PCT Pub. Date: May 9, 2019

(65) Prior Publication Data
US 2019/0229280 A1 Jul. 25, 2019

(51) Int. Cl.
*H01L 51/00* (2006.01)
*H01L 51/52* (2006.01)
(Continued)

(52) U.S. Cl.
CPC ........ *H01L 51/0097* (2013.01); *H01L 27/323* (2013.01); *H01L 27/3232* (2013.01);
(Continued)

(58) Field of Classification Search
None
See application file for complete search history.

(56) References Cited

U.S. PATENT DOCUMENTS

| 10,079,369 B2 * | 9/2018 | Kuang ................ H01L 27/3232 |
| 2011/0291552 A1 * | 12/2011 | Kwon ...................... C09K 9/02 |
| | | 313/504 |

(Continued)

FOREIGN PATENT DOCUMENTS

| CN | 102737576 A | 10/2012 |
| CN | 105304677 A | 2/2016 |

(Continued)

*Primary Examiner* — J. E. Schoenholtz
(74) *Attorney, Agent, or Firm* — Hemisphere Law, PLLC; Zhigang Ma

(57) ABSTRACT

The present disclosure discloses a flexible OLED display including: a flexible substrate, including a first surface and a second surface opposite to each other; an organic electroluminescent component arranged on the first surface; and a photochromic component arranged on the second surface, wherein the photochromic component generates different color changes according to an intensity of an external ambient light so as to completely absorb the external ambient light. The present disclosure further discloses a manufacturing method of a flexible OLED display. The flexible OLED display and the manufacturing method thereof according to the present disclosure can eliminate the influence of the external ambient light on the display and improve the display contrast.

6 Claims, 3 Drawing Sheets

(51) Int. Cl.
*H01L 51/50* (2006.01)
*H01L 27/32* (2006.01)
*H01L 51/56* (2006.01)

(52) U.S. Cl.
CPC ...... *H01L 51/5012* (2013.01); *H01L 51/5246* (2013.01); *H01L 51/5253* (2013.01); *H01L 51/56* (2013.01); *H01L 2251/5338* (2013.01)

(56) References Cited

U.S. PATENT DOCUMENTS

2016/0204170 A1    7/2016  Kwon et al.
2017/0200773 A1    7/2017  Li et al.
2018/0102507 A1*   4/2018  Kuang ................ H01L 27/3232

FOREIGN PATENT DOCUMENTS

| CN | 105702877   |  6/2016 |
| CN | 105870351 A |  8/2016 |
| CN | 106164716 A | 11/2016 |
| CN | 107305903 A | 10/2017 |

\* cited by examiner

FLEXIBLE OLED DISPLAY AND MANUFACTURING METHOD THEREOF

RELATED APPLICATIONS

The present application is a National Phase of International Application Number PCT/CN2017/110825, filed Nov. 14, 2017, and claims the priority of China Application No. 201711059131.7, filed Nov. 1, 2017.

FIELD OF THE DISCLOSURE

The present disclosure relates to an organic electroluminescence technology field, and more particularly to a flexible OLED display and a manufacturing method thereof.

BACKGROUND OF THE DISCLOSURE

In recent years, Organic Light-Emitting Diode (OLED) displays have become very popular emerging flat display devices at home and abroad. Because the OLED display has the advantages of self-luminous, wide viewing angle, short reaction time, high luminous efficiency, wide color gamut, low operating voltage, thin thickness, can produce large size and flexible display and simple manufacturing process. And the OLED display has the potential of low cost.

In recent years, flexible and foldable OLED displays are the new focal points in the display industry. However, the contrast of flexible OLED displays may vary greatly depending on the external environment (mainly the intensity of the external ambient light). For example, in a bright environment, the external ambient light may be emitted in various layers, such as the organic electroluminescent layer and the thin film transistor layer of the flexible OLED display, another part of the external ambient light through the flexible OLED display, the light through the external environment of the flexible OLED display and the organic electroluminescent layer of light mixed to reduce the contrast of the screen, seriously affecting the product's effect.

SUMMARY OF THE DISCLOSURE

In order to solve the problems in the prior art, an object of the present disclosure is to provide a flexible OLED display capable of improving display contrast and a method for fabricating the same.

According to an aspect of the present disclosure, there is provided a flexible OLED display including: a flexible substrate, including a first surface and a second surface opposite to each other; an organic electroluminescent component arranged on the first surface; and a photochromic component arranged on the second surface, wherein the photochromic component generates different color changes according to an intensity of an external ambient light so as to completely absorb the external ambient light.

Wherein, when the intensity of the external ambient light is not less than a predetermined light, the photochromic component discolors deeply, and a light transmittance of the photochromic component is not greater than a first predetermined light transmittance to completely absorb the external ambient light.

Wherein, when the intensity of the external ambient light is less than the predetermined light, the photochromic component discolors slightly, and the light transmittance of the photochromic component is greater than the first predetermined light transmittance and is not greater than a second predetermined light transmittance to completely absorb the external ambient light, the second predetermined light transmittance is greater than the first predetermined light transmittance.

Wherein the photochromic component includes: a photochromic material layer arranged on the second surface, the photochromic material layer varying in color according to the intensity of the external ambient light so as to completely absorb the external ambient light; and a support substrate arranged on a surface of the photochromic material layer facing away from the second surface to support the photochromic material layer.

Wherein the photochromic component includes: a first support substrate arranged on the second surface; a photochromic material layer arranged on a surface of the first support substrate facing away from the second surface, the photochromic material layer varying in color according to the intensity of the external ambient light so as to completely absorb the external ambient light; a second support substrate arranged on a surface of the photochromic material layer away from the first support substrate, the first support substrate and the second substrate are used to support the photochromic material layer; and a sealing component arranged between the first support substrate and the second support substrate and at a side terminal of the photochromic material layer to seal the photochromic material layer.

According to another aspect of the present disclosure, there is also provided a manufacturing method of a flexible OLED display, including: providing a flexible substrate, wherein the flexible substrate includes a first surface and a second surface; forming an organic electroluminescent component on the first surface; and forming a photochromic component and attaching the photochromic component on the second surface, wherein the photochromic component generates different color changes according to an intensity of an external ambient light so as to completely absorb the external ambient light.

Wherein the method of forming a photochromic component and attaching the photochromic component on the second surface includes: providing a support substrate; forming a photochromic material layer on the support substrate, the photochromic material layer varying in color according to the intensity of the external ambient light so as to completely absorb the external ambient light; and attaching a surface of the photochromic material layer facing away from the support substrate to the second surface with optical glue.

Wherein the method of forming a photochromic component and attaching the photochromic component on the second surface includes: providing a first support substrate; forming a photochromic material layer on a surface of the first support substrate facing away from the second surface, the photochromic material layer varying in color according to the intensity of the external ambient light so as to completely absorb the external ambient light; providing a second support substrate, arranging the second support substrate on a surface of the photochromic material layer facing away from the first support substrate, the first support substrate and the second support substrate are used to support the photochromic material layer; forming a sealing component arranged between the first support substrate and the second support substrate and both sides of the photochromic material layer to seal the photochromic material layer; and attaching a surface of the second support substrate facing away from the photochromic material layer on the second surface.

The beneficial effects of the present disclosure are as follows: the flexible OLED display and the manufacturing method thereof according to the present disclosure can eliminate the influence of the external ambient light on the display and improve the display contrast.

BRIEF DESCRIPTION OF THE DRAWINGS

The above and other aspects, features, and advantages of the embodiments of the present disclosure will become more apparent from the following description taken in conjunction with the accompanying drawings. In the figures.

DETAILED DESCRIPTION OF PREFERRED EMBODIMENTS

Figure 1:
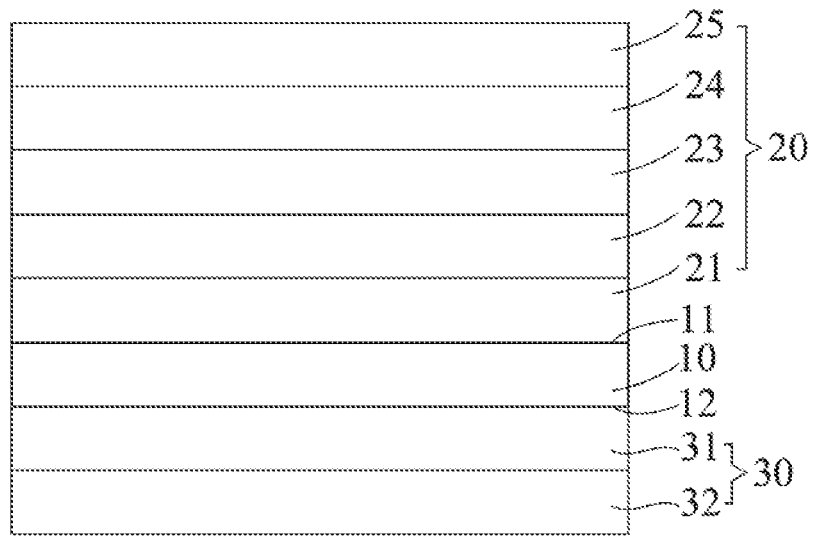
FIG. 1 is a schematic structural diagram of a flexible OLED display according to Embodiment 1 of the present disclosure.

Hereinafter, embodiments of the present disclosure will be described in detail with reference to the accompanying drawings. However, the disclosure may be embodied in many different forms and should not be construed as limited to the specific embodiments set forth herein. Rather, these embodiments are provided to explain the principles of the disclosure and its practical application to thereby enable those of ordinary skill in the art to understand various embodiments of the disclosure and various modifications as are suited to the particular use contemplated.

In the drawings, the thickness of layers and regions are exaggerated for clarity of the device. The same reference numbers indicate the same components throughout the specification and the drawings.

FIG. 1 is a schematic structural diagram of a flexible OLED display according to a first embodiment of the present disclosure.

Referring to FIG. 1, a flexible OLED display according to Embodiment 1 of the present disclosure includes a flexible substrate 10, an organic electroluminescent component 20 and a photochromic component 30.

The flexible substrate 10 includes a first surface 11 and a second surface 12 opposite to each other. In the present embodiment, the flexible substrate 10 may formed by polyimide (PI). However, the present disclosure is not limited thereto.

The organic electroluminescent component 20 arranged on the first surface 11. In the present embodiment, the organic electroluminescent component 20 is for emitting light autonomously to display an image.

Specifically, in the present embodiment, the organic electroluminescent component 20 includes a switch layer 21, an organic light-emitting layer 22, an encapsulation layer 23, a touch layer 24 and a polarizer 25 sequentially in a direction away from the first surface 11.

The switch layer 21 is arranged on the first surface 11. The switch layer 21 typically includes a plurality of thin film transistors, which are typically arranged in an array. Switches in the switch layer 21 are typically used to control the OLED devices in the organic light-emitting layer 22.

The organic light-emitting layer 22 is arranged on the switch layer 21, the organic light-emitting layer 22 is for emitting light autonomously. The organic light-emitting layer 22 generally includes several OLED devices, which are arranged in an array. As an embodiment of the present disclosure, the thin film transistor and the OLED device are in a one-to-one correspondence, and the corresponding thin film transistor controls the corresponding OLED device, but the present disclosure is not limited thereto.

The encapsulation layer 23 arranged on the organic light-emitting layer 22 is for encapsulating the organic light-emitting layer 22 so as to prevent the organic light-emitting layer 22 from being attacked by moisture and oxygen.

The touch layer 24 is arranged on the encapsulation layer 23. The touch layer 24 is generally used for touch control operation.

The polarizer 25 is arranged on the touch layer 24.

The photochromic component 30 arranged on the second surface 12, wherein the photochromic component 30 generates different color changes according to an intensity of an external ambient light so as to completely absorb the external ambient light.

Specifically, the photochromic component 30 includes a photochromic material layer 31 and a support substrate 32.

The photochromic material layer 31 is arranged on the second surface 12. The photochromic material layer 31 varying in color according to the intensity of the external ambient light so as to completely absorb the external ambient light. Wherein the photochromic material layer 31 may be composed of one or more of photochromic materials such as $AgCl$, $ZnCl_2$, $CuCl_2$, $MgCl_2$ and the like. In addition, the number of the photochromic material layers of the present disclosure is not limited to one layer, and may be a multi-layer composite structure.

When the intensity of the external ambient light is not less than a predetermined light, the photochromic material layer 31 discolors deeply, and a light transmittance of the photochromic material layer 31 is not greater than a first predetermined light transmittance to completely absorb the external ambient light. In other words, when the external ambient light is applied to the photochromic material layer 31 through the first support substrate 32, the photochromic material in the photochromic material layer 31 discolors deeply in a bright environment. The deeply discolored photochromic material layer 31 can effectively absorb external ambient light so as to prevent the light of the external environment from entering the organic electroluminescent element 20 and mixing with the light emitted by the organic light-emitting layer 22 to improve the contrast of the flexible OLED display.

When the intensity of the external ambient light is less than the predetermined light, the photochromic material layer 31 discolors slightly, and the light transmittance of the photochromic material layer 31 is greater than the first predetermined light transmittance and is not greater than a second predetermined light transmittance to completely absorb the external ambient light, the second predetermined light transmittance is greater than the first predetermined light transmittance. In other words, when the external ambient light is applied to the photochromic material layer 31 through the first support substrate 32, the photochromic material in the photochromic material layer 31 will be slightly discolored in a low light environment. The slightly discolored photochromic material layer 31 can effectively absorb the external weak light so as to prevent the light of the external environment from entering the organic electroluminescent element 20 to mix with the light emitted by the organic light-emitting layer 22 to improve the contrast of the flexible OLED display.

Figure 2A:
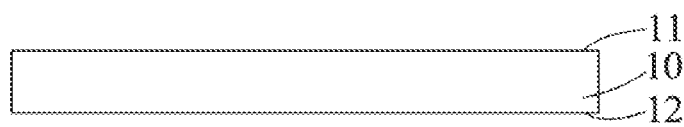
FIG. 2A to 2C are process diagrams of a flexible OLED display according to Embodiment 1 of the present disclosure.
Figure 2B:
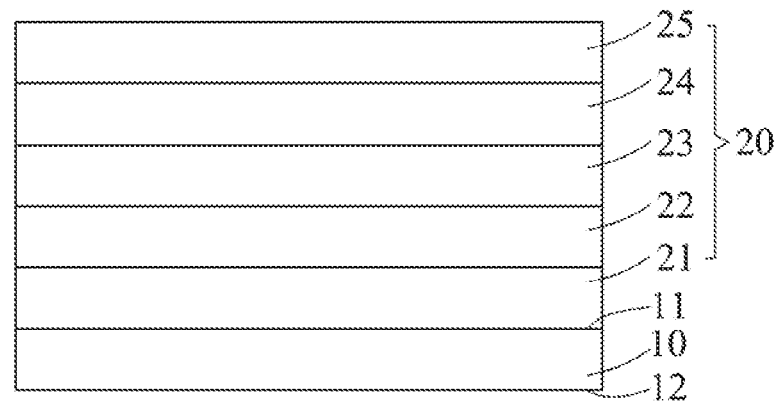
Figure 2C:
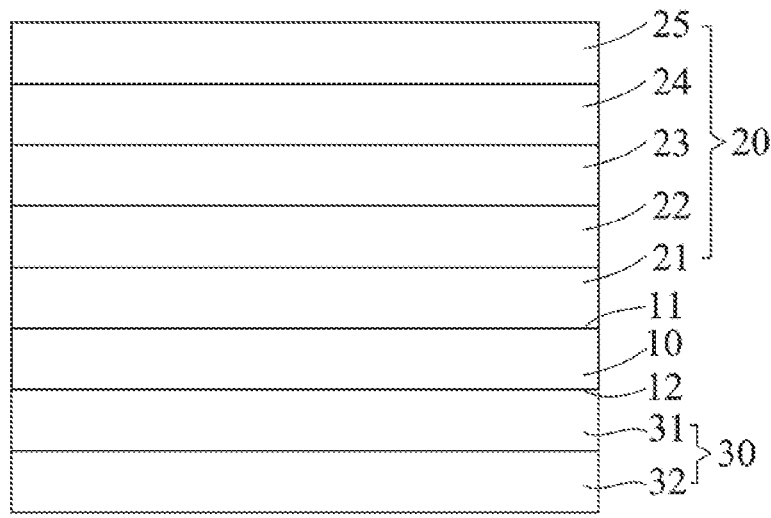

FIG. 2A to 2C are process diagrams of a flexible OLED display according to Embodiment 1 of the present disclosure.

The flexible OLED display according to Embodiment 1 of the present disclosure includes step 1 to step 3.

Step 1: referring to FIG. 1 and FIG. 2A, providing a flexible substrate 10.

Step 2: referring to FIG. 1 and FIG. 2B, forming the organic electroluminescent element 20 on the first surface 11. Wherein the method of forming the organic electroluminescent element 20 specifically includes: sequentially forming the switch layer 21, the organic light-emitting layer 22, the encapsulation layer 23, the touch layer 24 and the polarizer 25 on the first surface 11.

Step 3: referring to FIG. 1 and FIG. 2C, forming the photochromic component 30 and attaching the photochromic component 30 on the second surface 12.

Specifically, the method of forming the photochromic component 30 and attaching the photochromic component 30 on the second surface 12 includes:

providing a first support substrate 32. In the present embodiment, the first support substrate 32 may be made of polyimide (PI), but the disclosure is not limited thereto;

forming a photochromic material layer 31 on the first support substrate 32; and attaching a surface of the photochromic material layer 31 facing away from the first support substrate 32 to the second surface 12 with optical glue.

Figure 3:
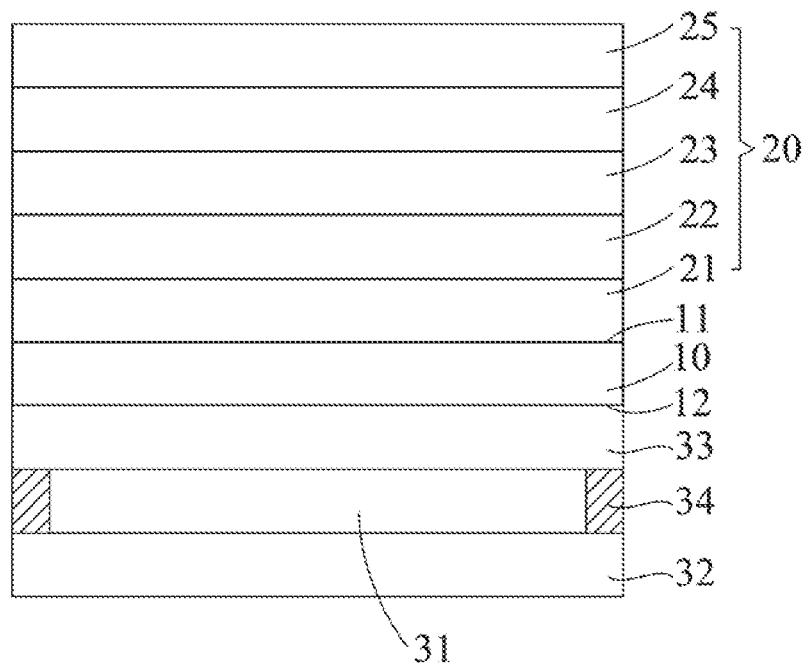
FIG. 3 is a schematic structural diagram of a flexible OLED display according to Embodiment 2 of the present disclosure.

FIG. 3 is a schematic structural diagram of a flexible OLED display according to Embodiment 2 of the present disclosure.

Referring to FIG. 3, The difference from the structure of the flexible OLED display of Embodiment 1 shown in FIG. 1 is: the photochromic component 30 further includes a second support substrate 33 and a sealing component 34.

The second support substrate 33 is arranged between the second surface 12 and the photochromic material layer 31 to support the photochromic material layer 31. The sealing component 34 is arranged between the first support substrate 32 and the second support substrate 33 and at a side terminal of the photochromic material layer 31 to seal the photochromic material layer 31. In the present embodiment, the sealing component 34 may be a sealant, but the disclosure is not limited thereto.

In the present embodiment, by sealing the photochromic material layer 31, the photochromic material layer 31 can be prevented from being damaged by moisture or oxygen, so as to improve the service life of the photochromic material layer 31.

Figure 4A:
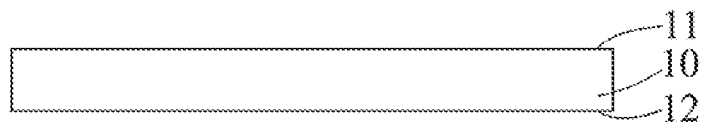
FIG. 4A to 4C are process diagrams of a flexible OLED display according to Embodiment 2 of the present disclosure.
Figure 4B:
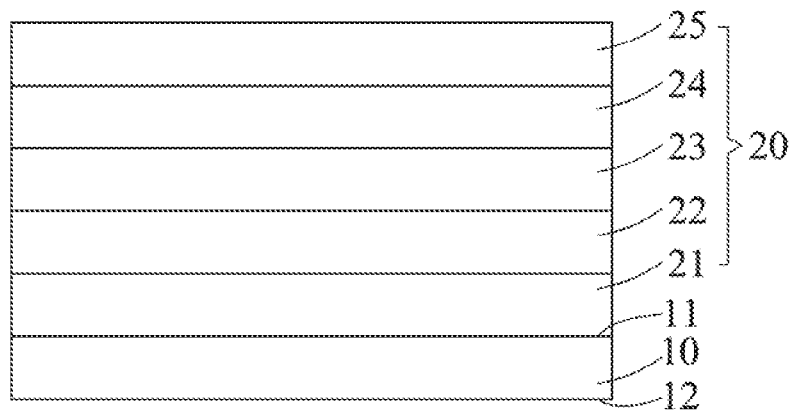
Figure 4C:
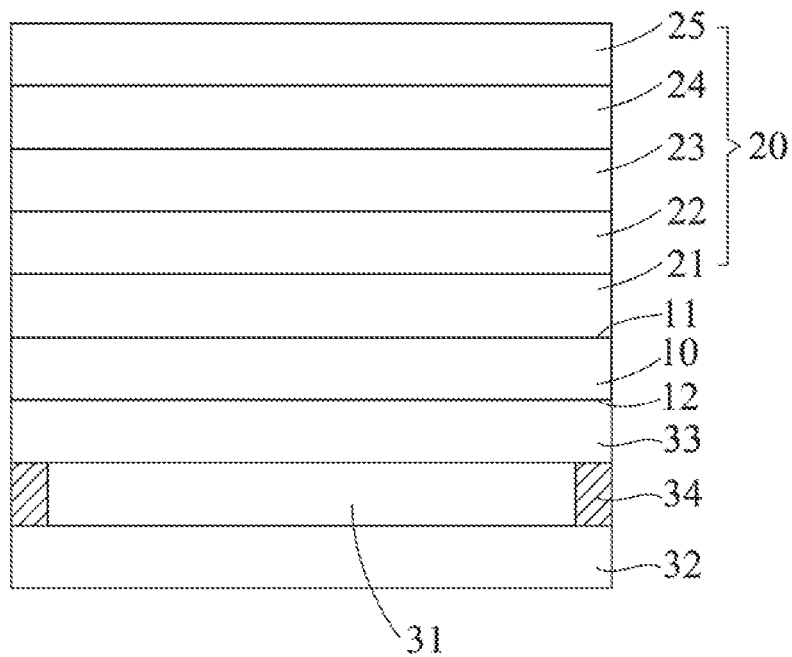

FIG. 4A to 4C are process diagrams of a flexible OLED display according to Embodiment 2 of the present disclosure.

The flexible OLED display according to Embodiment 2 of the present disclosure includes step 1 to step 3.

Step 1: referring to FIG. 3 and FIG. 4A, providing a flexible substrate 10.

Step 2: referring to FIG. 3 and FIG. 4B, forming the organic electroluminescent element 20 on the first surface 11. Wherein the method of forming the organic electroluminescent element 20 specifically includes: sequentially forming the switch layer 21, the organic light-emitting layer 22, the encapsulation layer 23, the touch layer 24 and the polarizer 25 on the first surface 11.

Step 3: referring to FIG. 3 an FIG. 4C, forming the photochromic component 30 and attaching the photochromic component 30 on the second surface 12.

Specifically, the method of forming the photochromic component 30 and attaching the photochromic component 30 on the second surface 12 includes:

providing a first support substrate 32. In the present embodiment, the first support substrate 32 may be made of polyimide (PI), but the disclosure is not limited thereto;

forming a photochromic material layer 31 on the first support substrate 32;

providing a second support substrate 33 arranged on a surface of the photochromic material layer 31 facing away from the first support substrate 32.

forming a sealing component 34 arranged between the first support substrate 32 and the second support substrate 33 and both sides of the photochromic material layer 31 to seal the photochromic material layer 31; and attaching a surface of the second support substrate 33 facing away from the photochromic material layer 31 on the second surface 12.

In summary, according to the embodiments of the present disclosure, it is possible to eliminate the influence of the external ambient light on the display and improve the display contrast.

Although the disclosure has been shown and described with reference to specific embodiments, it will be understood by those skilled in the art that various changes in form and details may be made therein without departing from the spirit and scope of the disclosure as defined by the appended claims and their equivalents.

What is claimed is:

1. A flexible OLED display, comprising:
   a flexible substrate, comprising a first surface and a second surface opposite to each other;
   an organic electroluminescent component arranged on the first surface; and
   a photochromic component arranged on the second surface, wherein the photochromic component generates different color changes according to an intensity of an external ambient light so as to completely absorb the external ambient light;
   wherein the photochromic component comprises:
   a photochromic material layer arranged on the second surface, the photochromic material layer varying in color according to the intensity of the external ambient light so as to completely absorb the external ambient light; and
   a support substrate arranged on a surface of the photochromic material layer facing away from the second surface to support the photochromic material layer.

2. The flexible OLED display according to claim 1, wherein, when the intensity of the external ambient light is not less than a predetermined light, the photochromic component discolors, and a light transmittance of the photochromic component is not greater than a first predetermined light transmittance to completely absorb the external ambient light.

3. The flexible OLED display according to claim 2, wherein, when the intensity of the external ambient light is less than the predetermined light, the photochromic component discolors slightly, and the light transmittance of the photochromic component is greater than the first predetermined light transmittance and is not greater than a second predetermined light transmittance to completely absorb the external ambient light, the second predetermined light transmittance is greater than the first predetermined light transmittance.

4. A manufacturing method of a flexible OLED display, comprising:
   providing a flexible substrate, wherein the flexible substrate comprises a first surface and a second surface;
   forming an organic electroluminescent component on the first surface; and
   forming a photochromic component and attaching the photochromic component on the second surface, wherein the photochromic component generates different color changes according to an intensity of an external ambient light so as to completely absorb the external ambient light;
   wherein the method of forming a photochromic component and attaching the photochromic component on the second surface comprises:
   providing a first support substrate;
   forming a photochromic material layer on a surface of the first support substrate facing away from the second surface, the photochromic material layer varying in color according to the intensity of the external ambient light so as to completely absorb the external ambient light;
   providing a second support substrate, arranging the second support substrate on a surface of the photochromic material layer facing away from the first support substrate, the first support substrate and the second support substrate are used to support the photochromic material layer;
   forming a sealing component arranged between the first support substrate and the second support substrate and both sides of the photochromic material layer to seal the photochromic material layer; and
   attaching a surface of the second support substrate facing away from the photochromic material layer on the second surface.

5. The manufacturing method of a flexible OLED display according to claim 4, wherein, when the intensity of the external ambient light is not less than a predetermined light, the photochromic component discolors deeply, and a light transmittance of the photochromic component is not greater than a first predetermined light transmittance to completely absorb the external ambient light.

6. The manufacturing method of a flexible OLED display according to claim 5, wherein, when the intensity of the external ambient light is less than the predetermined light, the photochromic component discolors slightly, and the light transmittance of the photochromic component is greater than the first predetermined light transmittance and is not greater than a second predetermined light transmittance to completely absorb the external ambient light, the second predetermined light transmittance is greater than the first predetermined light transmittance.

* * * * *